United States Patent [19]

Wu

[11] Patent Number: 5,747,377

[45] Date of Patent: May 5, 1998

[54] PROCESS FOR FORMING SHALLOW TRENCH ISOLATION

[75] Inventor: Shye-Lin Wu, Hsinchu, Taiwan

[73] Assignee: Powerchip Semiconductor Corp., Hsinchu, Taiwan

[21] Appl. No.: 709,169

[22] Filed: Sep. 6, 1996

[51] Int. Cl.⁶ .................................................. H01L 21/76
[52] U.S. Cl. .......................... 438/444; 438/702; 438/947
[58] Field of Search .................................. 438/425, 426, 438/444, 702, 232, 947

[56] References Cited

U.S. PATENT DOCUMENTS

| | | |
|---|---|---|
| 5,308,786 | 5/1994 | Lur et al. . |
| 5,374,583 | 12/1994 | Lur et al. . |
| 5,393,373 | 2/1995 | Jun et al. . |
| 5,395,790 | 3/1995 | Lur . |

FOREIGN PATENT DOCUMENTS 59-96745   6/1984   Japan .

*Primary Examiner*—George R. Fourson
*Attorney, Agent, or Firm*—Ladas & Parry

[57] ABSTRACT

A process for forming a shallow trench isolation is disclosed. Initially, a gate oxide layer is formed on a substrate, and a silicon nitride, which defines an active area, is then patterned on the gate oxide layer. Next, hemispherical grain silicon is formed on the silicon nitride, the sidewalls of the silicon nitride, and the exposed gate oxide layer. Portions of the gate oxide layer are removed to form oxide islands using the silicon nitride and the hemispherical grain silicon as mask. Thereafter, portions of the substrate are removed using the oxide islands as mask. Finally, the exposed substrate is thermally oxidized to form the field oxide structure of the present invention.

18 Claims, 3 Drawing Sheets

5,747,377

PROCESS FOR FORMING SHALLOW TRENCH ISOLATION

BACKGROUND OF THE INVENTION

1. Field of the Invention

The present invention relates to a process for forming an isolation region, and more particularly to a process for forming a shallow trench isolation.

2. Description of the Prior Art

The art of isolating devices that are built on semiconductor chips is one important aspect of modern metal oxide semiconductor (MOS) and bipolar integrated circuit technology as many as hundreds of thousands of devices are used in a single chip. Improper isolation among transistors will cause current leakage, which can consume significant power for the entire chip. In addition, improper isolation can further escalate latchup which impairs proper functioning of the circuits on the chip either momentarily or permanently. Still further, improper isolation can result in noise margin degradation, voltage shift or crosstalk.

In MOS technology, isolation is usually practiced by forming isolation regions between neighboring active regions. Typically, an isolation region is formed by ion-doping a channel stop of polarity opposite to the source electrode and the drain electrode of the integrated circuit device, and growing a thick oxide, often referred to as field oxide (FOX). The channel stop and the FOX cause the threshold voltage in the isolation region to be much higher than those of the neighboring active devices, so that surface inversion does not occur under the field oxide region.

A conventional local oxidation of silicon (LOCOS) process is used to develop regions which laterally isolate the active devices on the integrated circuits. The LOCOS structure is typically formed by using a patterned silicon nitride layer over a pad oxide layer, which is utilized to release stress caused by the silicon nitride layer. The silicon nitride layer is patterned to mask the active regions. Ion implantation in the isolation regions is first performed followed by growing a thick field oxide locally. This structure possesses certain inherent drawbacks resulting from the processes, i.e., lateral oxidation of the silicon underneath the silicon nitride mask, making the edge of the field oxide resemble a bird beak. See N. Shimizu et al., "A poly-buffer recessed LOCOS process for 256 Mbit DRAM cell," in *IEDM*, p. 279, 1992. This effect impacts the active device regions, making the physical channel width less than the desired channel width. The bird beak effect will make the situation even worse when devices are scaled down for very large scale integration (VLSI) implementation since as the devices the bird beak looms larger and larger, increasing threshold voltage and reducing the current driving capability of the devices formed by VLSI.

Several methods are known in the prior art have for improving LOCOS isolation process to minimize the transition regions between active areas. For example, a side wall masked isolation (SWAMI) process has been proposed which involves the addition of a second silicon nitride layer on the side wall. The SWAMI offers basically near-zero bird beak, but at the expense of process complexity. Another method in the prior art is a sealed interface local oxidation (SILO) process which uses three layers of a silicon nitride over the silicon substrate followed by an oxide layer and a cap silicon nitride layer. The SILO can reduce the bird beak, but at the expense of generating more stress, more crystal defects, and higher leakage currents.

Another technique called trench isolation was developed to overcome the aforementioned problem. For example, a buried oxide (BOX) process has been devised which uses an aluminum mask to etch a silicon trench and the subsequent removal of a plasma deposited silicon dioxide layer. The BOX process can reduce the bird beak, but at the expense of manufacturing complexity. Further, a large defect is induced during a plasma etching. See A. Bryant et al., "Characteristics of CMOS device isolation for the ULSI age," in *IEDM*, p.671, 1994. Therefore, a need has been arisen for devising an isolation process with minimized bird beak effect, stress from thermal oxidation, and trench defect.

SUMMARY OF THE INVENTION

A process for forming a shallow trench isolation is disclosed. Initially, a gate oxide layer is grown thermally on a substrate, and a silicon nitride, which defines an active area, is then patterned on the gate oxide layer. Next, hemispherical grain silicon is formed on the silicon nitride, the sidewalls of the silicon nitride, and the exposed gate oxide layer. These hemispherical grain silicon is formed using a low pressure chemical vapor deposition method, an a-silicon deposition method or a molecular beam epitaxy technique. Portions of the gate oxide layer are etched to form oxide islands using the silicon nitride and the hemispherical grains as a mask. Next, these oxide islands are etched. Thereafter, portions of the substrate are etched using the oxide islands as a mask. Finally, the exposed substrate is thermally oxidized to form the field oxide structure of the present invention. Furthermore, the silicon nitride is etched, and portion of the oxidized substrate is then etched until unoxidized substrate is exposed.

BRIEF DESCRIPTION OF THE DRAWINGS

FIG. 1 to FIG. 9 are cross sectional views of a structure formed at various stages in the forming of a field isolation structure in a silicon substrate in accordance with the invention, wherein:

FIG. 1 shows the structure after a pad oxide layer and patterned silicon nitrides are formed on a substrate;

FIG. 2 shows the structure after a hemispherical grain silicon (HSG-Si) layer is deposited on the silicon nitrides, the sidewalls of the silicon nitrides, and the exposed pad oxide layer;

FIG. 3 shows the structure after the HSG-Si layer is slightly etched;

FIG. 4 shows the structure resulting from etching portions of the pad oxide to form oxide islands using the residual HSG-Si as mask;

FIG. 5 shows the structure resulting from etching portions of the substrate to form trenches between active areas;

FIG. 6 shows the structure after the oxide islands are etched using a wet etch process;

FIG. 7 shows the structure resulting from the oxidation of the exposed substrate;

FIG. 8 shows the structure after the silicon nitrides and portion of the oxidized substrate are etched until the unoxidized substrate is exposed; and FIG. 9 shows the CMOS transistor formed on the silicon substrate.

DESCRIPTION OF THE PREFERRED EMBODIMENT

Figure 1:
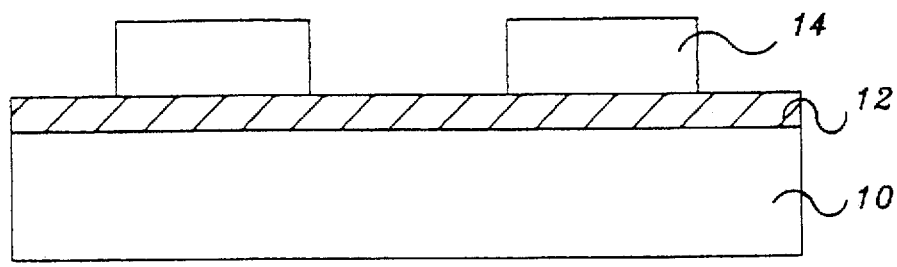

FIG. 1 shows a schematic cross section of a silicon substrate 10 having a pad oxide layer 12 grown thereon. This pad oxide layer 12 is grown using a conventional thermal oxidation process, and has a thickness of about 30~1000 angstroms. Next, a silicon nitride layer 14 having a thickness of about 500~3000 angstroms is deposited, for example using a low pressure chemical vapor deposition (LPCVD) method, on the pad oxide layer 12. The silicon nitride layer 14 is then patterned by a photoresist mask (not shown) having an active area pattern, resulting in the structure shown in FIG. 1. This patterning process is performed using standard photoresist coating, exposure and development processes.

Figure 2:
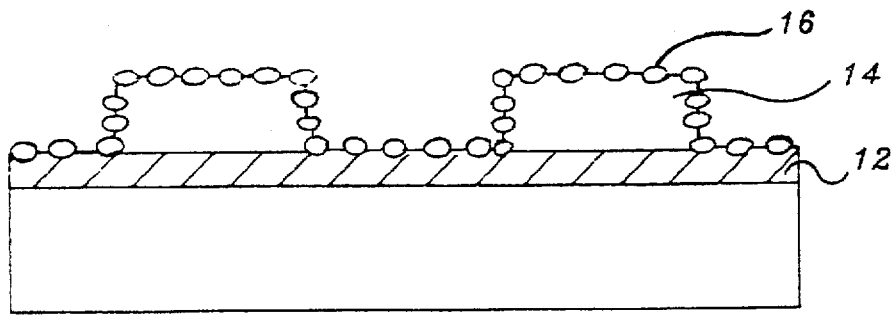

As illustrated in FIG. 2, a hemispherical grain silicon (HSG-Si) film 16 having a thickness of about 200~1000 angstroms is deposited over the silicon nitride 14, the sidewalls of the silicon nitride 14, and the exposed pad oxide 12. The HSG-Si film 16 can be formed using a low pressure chemical vapor deposition (LPCVD) process at a vacuum of about 0.25~2.0 torr and a temperature of about 565~595° C. Alternatively, the HSG-Si film 16 can be formed using a conventional silicon deposition technique at about 530° C., and then the HSG-Si film 16 is recrystallized at about 580~620° C. for 1–3 hours. Another technique to form the silicon film 16 is a molecular beam epitaxy (MBE). In molecular beam epitaxy, a beam of silicon atoms emanating from a source deposits onto the surface of the silicon nitride 14, the sidewalls of the silicon nitride 14 and the exposed pad oxide 12 at vacuum of about $10^{-10} \sim 10^{-11}$ torr.

Figure 3:
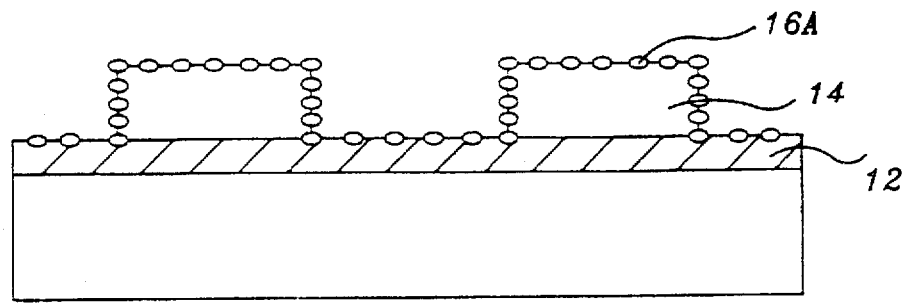

Next, this HSG-Si film 16 is slightly dry etched, resulting the residual hemispherical grains (HSG) 16A on the silicon nitride 14, the sidewalls of the silicon nitride 14, and the exposed pad oxide 12 as shown in FIG. 3.

Figure 4:
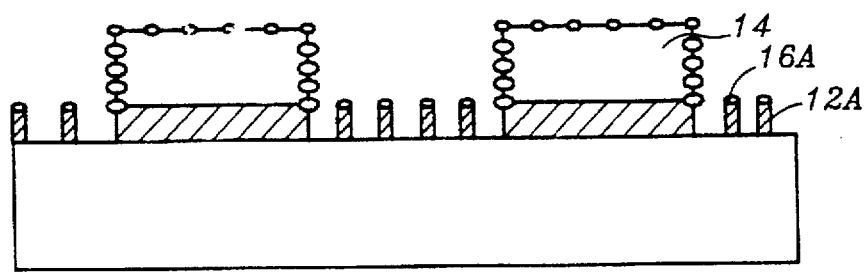

Turning now to FIG. 4, the hemispherical grains 16A are used as masks for anisotropically etching the exposed pad oxide 12 not covered by the hemispherical grains 16A to form oxide islands 12A. The etch process is preferably performed using a plasma etch method using $CF_4$ gas due to the high selectivity of $SiO_2$:Si (50~100:1). It is worth noting that the hemispherical grains 16A on the sidewalls of the silicon nitride 14 are affected less during the etch process than are the more exposed hemispherical grains. The hemispherical grains 16A on the sidewalls of the silicon nitride 14 will act as a protective film in later processing to largely reduce induced damage at or near the active areas of the devices yet to be formed.

Figure 5:
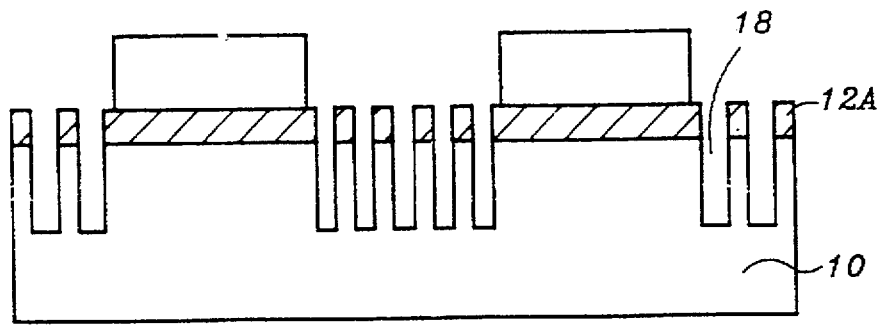

As is illustrated in FIG. 5, portions of the substrate 10 are etched using the oxide islands 12A as masks by a dry etching with etchant of $CF_4+O_2$ or $C_2F_6+O_2$, forming trenches 18 in the silicon with a depth of about 500~10000 angstroms.

Figure 6:
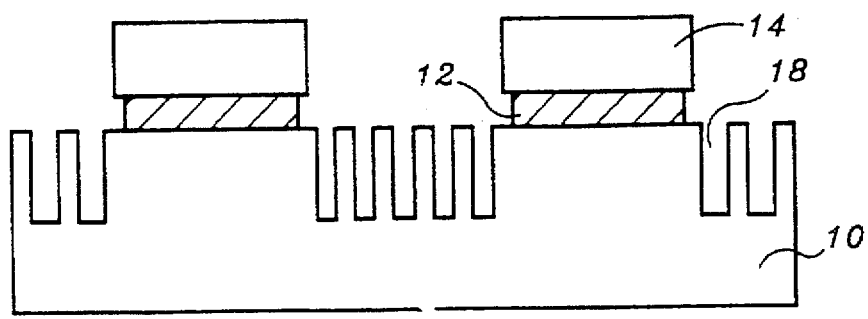

Next, the oxide islands 12A are etched, resulting in the structure shown in FIG. 6. The selective removal of those oxide islands 12A from the substrate 10 is preferably performed by a conventional wet etch method. The etchant is preferably a dilute hydrofluoric acid (HF), buffered with ammonium fluoride, commonly referred to as buffered oxide etch (BOE). The net reaction is:

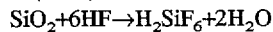

$$SiO_2 + 6HF \rightarrow H_2SiF_6 + 2H_2O$$

Since the etching of $SiO_2$ in BOE is isotropic, portions of the pad oxide 12 under the silicon nitride 14 are undercut as shown in FIG. 6. However, if a dry etch technique, such as a plasma etch, is used instead, there will be no undercut formed under the silicon nitride 14. Irrespective of whether an undercut is formed or not, it will have least the effect on the resultant structure or process in connection with the following step (FIG. 7).

Figure 7:
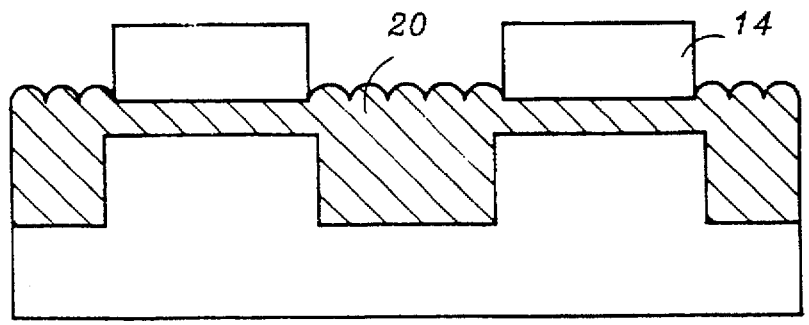
Figure 8:
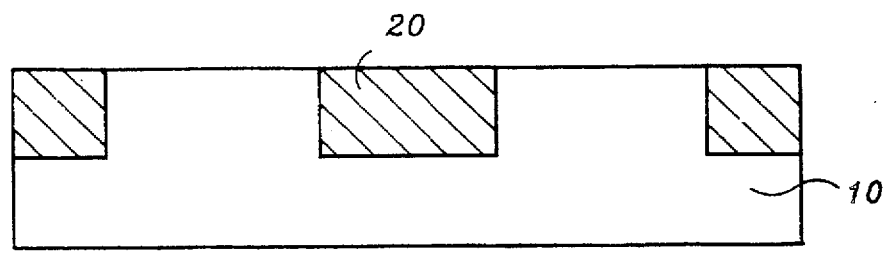

Referring now to FIG. 7, the silicon structure defining the trenches 18 are thermally oxidized in a conventional furnace at about 900~1150° C., forming field oxide 20 between active areas. Due to the trench 18 defining structures formed as was previously described with reference to FIG. 6, it takes less time to perform this oxidation than traditional oxidation on the flat surface of a silicon substrate, thereby minimizing the bird beak effect and the stress resulted from the thermal oxidation.

Thereafter, the silicon nitride 14 (FIG. 7) is etched. This etch process is typically performed at about 140~180° C. with a boiling phosphoric acid solution. Further, the oxidized silicon ($SiO_2$) is immersed in an etchant, such as a dilute hydrofluoric acid (HF) buffered with ammonium fluoride, until the unoxidized silicon substrate 10 is exposed. Alternatively, a planarization technique, such as a conventional chemical-mechanical polishing (CMP) method, can be used to remove the oxidized silicon until the unoxidized silicon substrate 10 is exposed.

Figure 9:
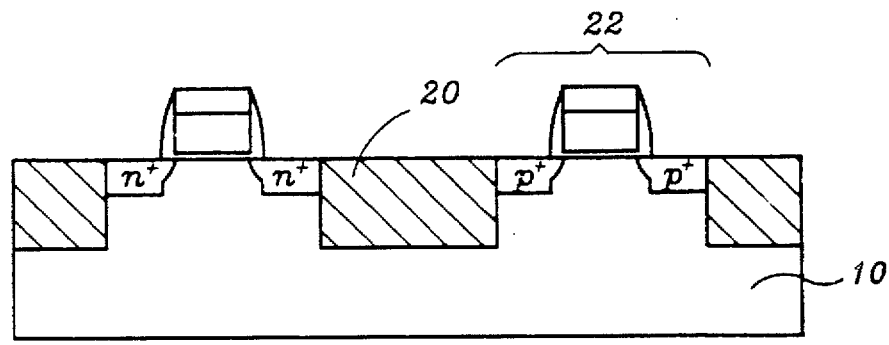

As illustrated in FIG. 9, conventional lightly doped drain (LDD) devices 22 are fabricated in and on the silicon substrate between the field oxide regions 20 formed according to the present invention. It is well understood that other types of devices than LDD can be equally well adapted to this field oxide structure.

Although specific embodiments have been illustrated and described it will be obvious to those skilled in the art that various modification may be made without departing from the spirit which is intended to be limited solely by the appended claims.

What is claimed is:

1. A process for forming a trench isolation region in a substrate, said process comprising:

forming a pad oxide layer on the substrate;

patterning silicon nitride on said pad oxide layer, said patterned silicon nitride defining an active area;

forming hemispherical grain silicon on said patterned silicon nitride, on sidewalls of said patterned silicon nitride, and on an exposed portion of pad oxide layer;

forming a plurality of oxide islands on the portion of the substrate not covered by said patterned silicon nitride by removing portions of said pad oxide layer, said patterned silicon nitride and said hemispherical grain silicon serving as mask;

removing portions of the substrate, said oxide islands serving as mask; and oxidizing the resulting exposed substrate.

2. The process according to claim 1, wherein the step of forming hemispherical grain silicon comprises the steps of:

forming a hemispherical grain silicon layer on said patterned silicon nitride, the sidewalls of said patterned silicon nitride, and the exposed portion of the pad oxide layer; and etching portions of said hemispherical grain silicon layer to form said hemispherical grain silicon.

3. The process according to claim 2, wherein said hemispherical grain silicon layer is formed using a chemical vapor deposition method at about 565°–595° C.

4. The process according to claim 2, wherein said hemispherical grain silicon layer is formed using an amorphous-silicon deposition method at about 530° C.

5. The process according to claim 4, further comprising recrystallizing said hemispherical grain silicon layer at about 580°–620° C. for 1–3 hours.

6. The process according to claim 2, wherein said hemispherical grain silicon layer is formed using molecular beam epitaxy.

7. The process according to claim 1, wherein the diameter of said hemispherical grain silicon is about 200–1000 angstroms.

8. The process according to claim 1, further comprising a step of removing said patterned silicon nitride.

9. The process according to claim 8, after said patterned silicon nitride is removed, further comprising a step of removing portion of the oxidized substrate until the unoxidized substrate is exposed.

10. A process for forming a trench isolation region in a substrate, said process comprising:

forming a pad oxide layer on the substrate;

patterning silicon nitride on said pad oxide layer, said patterned silicon nitride defining an active area;

forming hemispherical grain silicon on said patterned silicon nitride, on sidewalls of said patterned silicon nitride, and on the exposed pad oxide layer;

forming a plurality of oxide islands on the portions of the substrate not covered by said patterned silicon nitride by removing portions of said pad oxide layer, said patterned silicon nitride and said hemispherical grain silicon serving as mask;

removing portions of the substrate, said oxide islands serving as mask;

removing said oxide islands; and oxidizing the resulting exposed substrate.

11. The process according to claim 10, wherein the step for forming hemispherical grain silicon comprises the steps of:

forming a hemispherical grain silicon layer on said patterned silicon nitride, the sidewalls of said patterned silicon nitride, and the exposed pad oxide layer; and etching portions of said hemispherical grain silicon layer to form said hemispherical grain silicon.

12. The process according to claim 11, wherein said hemispherical grain silicon layer is formed using a chemical vapor deposition method at about 565°–595° C.

13. The process according to claim 11, wherein said hemispherical grain silicon layer is formed using an amorphous-silicon deposition method at about 530° C.

14. The process according to claim 13, further comprising recrystallizing said silicon layer at about 580°–620° C.

15. The process according to claim 11, wherein said hemispherical grain silicon layer is formed using molecular beam epitaxy.

16. The process according to claim 10, wherein the diameter of said hemispherical grain silicon is about 200–1000 angstroms.

17. The process according to claim 10, further comprising a step of removing said patterned silicon nitride.

18. The process according to claim 17, after said patterned silicon nitride is removed, further comprising a step of removing portion of the oxidized substrate until the unoxidized substrate is exposed.

* * * * *